(12) United States Patent
Bottman

(10) Patent No.: US 11,022,638 B2
(45) Date of Patent: Jun. 1, 2021

(54) TESTING SHIELD CONTINUITY OF A CABLE OR CABLING INSTALLATION USING COMMON MODE INSERTION LOSS

(71) Applicant: Fluke Corporation, Everett, WA (US)

(72) Inventor: Jeffrey S. Bottman, Seattle, WA (US)

(73) Assignee: Fluke Corporation, Everett, WA (US)

( * ) Notice: Subject to any disclaimer, the term of this patent is extended or adjusted under 35 U.S.C. 154(b) by 409 days.

(21) Appl. No.: 15/945,600

(22) Filed: Apr. 4, 2018

(65) Prior Publication Data
US 2019/0310298 A1    Oct. 10, 2019

(51) Int. Cl.
| | | |
|---|---|---|
| G01R 29/08 | (2006.01) | |
| H01B 7/32 | (2006.01) | |
| G01R 31/08 | (2020.01) | |
| G01R 31/12 | (2020.01) | |
| G01R 27/28 | (2006.01) | |
| G01R 31/58 | (2020.01) | |
| H01B 11/06 | (2006.01) | |

(52) U.S. Cl.
CPC ......... *G01R 29/0835* (2013.01); *G01R 27/28* (2013.01); *G01R 31/08* (2013.01); *G01R 31/083* (2013.01); *G01R 31/1272* (2013.01); *G01R 31/58* (2020.01); *H01B 7/328* (2013.01); *H01B 11/06* (2013.01)

(58) Field of Classification Search
CPC ............................ G01R 27/28; G01R 29/0835
See application file for complete search history.

(56) References Cited

U.S. PATENT DOCUMENTS

| | | |
|---|---|---|
| 6,980,007 B1 | 12/2005 | Lo et al. |
| 7,026,825 B1 | 4/2006 | Lo et al. |
| 8,570,049 B2 | 10/2013 | Bottman et al. |
| 2002/0024342 A1 | 2/2002 | Bussinger |
| 2006/0203227 A1 | 9/2006 | Unger et al. |
| 2009/0058426 A1* | 3/2009 | Crain .................. G01R 31/001 324/627 |
| 2012/0146666 A1 | 6/2012 | Bottman et al. |

OTHER PUBLICATIONS

Extended European Search Report, dated Aug. 21, 2019, for corresponding European Application No. 19167337.5-1022, 10 pages.

* cited by examiner

*Primary Examiner* — Minh Q Phan
(74) *Attorney, Agent, or Firm* — Seed IP Law Group LLP

(57) ABSTRACT

A method and apparatus for testing shield continuity are provided. In the method and apparatus, a transmitter transmits a first signal in common mode over a plurality of conductors of a cable or cabling installation having a shield. The first signal is transmitted in the common mode at a first end of the plurality of conductors. A receiver receives a plurality of second signals representative of the first signal at a second end of the plurality of conductors, respectively, and outputs data representative of the plurality of second signals. A processor receives the data representative of the plurality of second signals, determines a common mode insertion loss for the cable or cabling installation based on the plurality of second signals, determines, based on the common mode insertion loss, whether the shield is continuous or discontinuous and outputs data representative of whether the shield is continuous or discontinuous.

20 Claims, 9 Drawing Sheets

TESTING SHIELD CONTINUITY OF A CABLE OR CABLING INSTALLATION USING COMMON MODE INSERTION LOSS

BACKGROUND

Technical Field

This application is directed to a method and apparatus for detecting shield continuity in a cable or a cabling installation based on common mode insertion loss and, in particular, insertion loss of signals transmitted in common mode over one or more twisted pairs of conductors of the cable or cabling installation.

Description of the Related Art

Electrical cables include shields that reduce electromagnetic interference of an outside environment that can reach conductors of a cable. The cables may be twisted pairs of conductors. Discontinuities in the shield, which may manifest as a break or tear in the shield, degrade the crosstalk (XT) performance of the cable. Direct current (DC) verification techniques of shield continuity are prone to yield a false positive test result (i.e., 'pass' a discontinuous shield) when the shield is grounded. Further, the presence of a parasitic inductance, for example, due to shield termination at a connector, may cause shield verification techniques to yield a false negative test result (i.e., 'fail' a continuous shield).

BRIEF SUMMARY

In an embodiment, a shield continuity testing device includes a transmitter configured to transmit a first signal in common mode over a plurality of conductors of a cable or cabling installation having a shield. In an embodiment, the transmitter is configured to transmit the first signal in the common mode at a first end of the plurality of conductors. In an embodiment, a shield continuity testing device includes a receiver configured to receive a plurality of second signals representative of the first signal at a second end of the plurality of conductors, respectively, and output data representative of the plurality of second signals. In an embodiment, a shield continuity testing device includes a processor configured to: receive the data representative of the plurality of second signals; determine a common mode insertion loss for the cable or cabling installation based on the plurality of second signals; determine, based on the common mode insertion loss, whether the shield is continuous or discontinuous; and output data representative of whether the shield is continuous or discontinuous.

In an embodiment, the first signal spans a frequency range, and the transmitter is configured to transmit the first signal at a plurality of frequency points in the frequency range. In an embodiment, the processor is configured to determine the common mode insertion loss by at least: determining, based on the plurality of second signals, the common mode insertion loss at each frequency point of the plurality of frequency points in the frequency range. In an embodiment, the frequency range is between 1 and 20 megahertz (MHz). In an embodiment, the processor is configured to determine whether the shield is continuous or discontinuous by at least: determining an expected common mode insertion loss for the cable or cabling installation; determining an offset common mode insertion loss as a difference between the expected common mode insertion loss and the determined common mode insertion loss; and determining whether the shield is continuous or discontinuous based on the offset common mode insertion loss.

In an embodiment, the processor is configured to determine whether the shield is continuous or discontinuous by at least: determining a figure of merit for the offset common mode insertion loss; and comparing the figure of merit to a threshold. In an embodiment, the processor is configured to determine the figure of merit by at least: determining a mean of the offset common mode insertion loss over a plurality of frequency points in a frequency range over which the first signal is transmitted; determining a standard deviation of a difference between the offset common mode insertion loss over the plurality of frequency points and a least mean square fit of the offset common mode insertion loss over the plurality of frequency points; and determining the figure of merit as a difference between the mean and the standard deviation.

In an embodiment, the processor is configured to determine that the shield is continuous if the figure of merit is greater than or equal to the threshold and determine that the shield is discontinuous if the figure of merit is less than the threshold. In an embodiment, the processor is configured to determine whether the shield is continuous or discontinuous based on the common mode insertion loss in a subrange of the frequency range over which the first signal is transmitted. In an embodiment, the processor is configured to: identify the subrange based on a determined signal propagation delay of the cable or cabling installation.

In an embodiment, a location of the subrange in the frequency range is inversely correlated to the propagation delay such that an increase in the propagation delay results in shifting the subrange towards a beginning of the frequency range and a decrease in the propagation delay results in shifting the subrange towards an end of the frequency range. In an embodiment, the plurality of conductors of the cable or the cabling installation have a twisted pair arrangement in which a pair of conductors of the plurality of conductors are pair-wise twisted around each other. In an embodiment, a shield continuity testing device includes an output device, communicatively coupled to the processor, configured to receive the data representative of whether the shield is continuous or discontinuous, and output an indication of whether the shield is continuous or discontinuous.

In an embodiment, the processor is configured to determine a location of a discontinuity of the shield by at least: determining a common mode return loss for the cable or cabling installation; applying a Fourier transform to the common mode return loss to obtain time domain data; scaling the time domain data using a compensation vector; determining an index associated with a maximum of the scaled time domain data; and determining the location of the discontinuity along the cable or cabling installation based on the index associated with the maximum of the scaled time domain data. In an embodiment, a relative location of the index in the scaled time domain data corresponds to the relative location of the discontinuity in the shield.

In an embodiment, a method for testing shield continuity includes transmitting a first signal in common mode over a plurality of conductors of a cable or a cabling installation having a shield, the first signal in the common mode at a first end of the plurality of conductors; receiving a plurality of second signals representative of the first signal at a second end of the plurality of conductors, respectively; determining a common mode insertion loss for the cable or cabling installation based on the plurality of second signals; determining, based on the common mode insertion loss, whether the shield is continuous or discontinuous; and outputting data representative of whether the shield is continuous or discontinuous.

In an embodiment, a method includes transmitting the first signal over a plurality of frequency points in a frequency range. In an embodiment, a method includes determining, based on the plurality of second signals, the common mode insertion loss at each frequency point of the plurality of frequency points in the frequency range. In an embodiment, the frequency range is between 1 and 20 megahertz (MHz). In an embodiment, a method includes determining an expected common mode insertion loss for the cable or cabling installation; determining an offset common mode insertion loss as a difference between the expected common mode insertion loss and the determined common mode insertion loss; and determining whether the shield is continuous or discontinuous based on the offset common mode insertion loss.

In an embodiment, a method includes determining a mean of the offset common mode insertion loss over a plurality of frequency points in a frequency range over which the first signal is transmitted; determining a standard deviation of a difference between the offset common mode insertion loss over the plurality of frequency points and a least mean square fit of the offset common mode insertion loss over the plurality of frequency points; determining a figure of merit as a difference between the mean and the standard deviation; and determining that the shield is continuous if the figure of merit is greater than or equal to a threshold and determine that the shield is discontinuous if the figure of merit is less than the threshold. In an embodiment, a method includes determining a common mode return loss for the cable or cabling installation; applying a Fourier transform to the common mode return loss to obtain time domain data; scaling the time domain data using a compensation vector; determining an index associated with a maximum of the scaled time domain data; and determining a location of a discontinuity along the cable or cabling installation based on the index associated with the maximum of the scaled time domain data.

DETAILED DESCRIPTION

Figure 1:
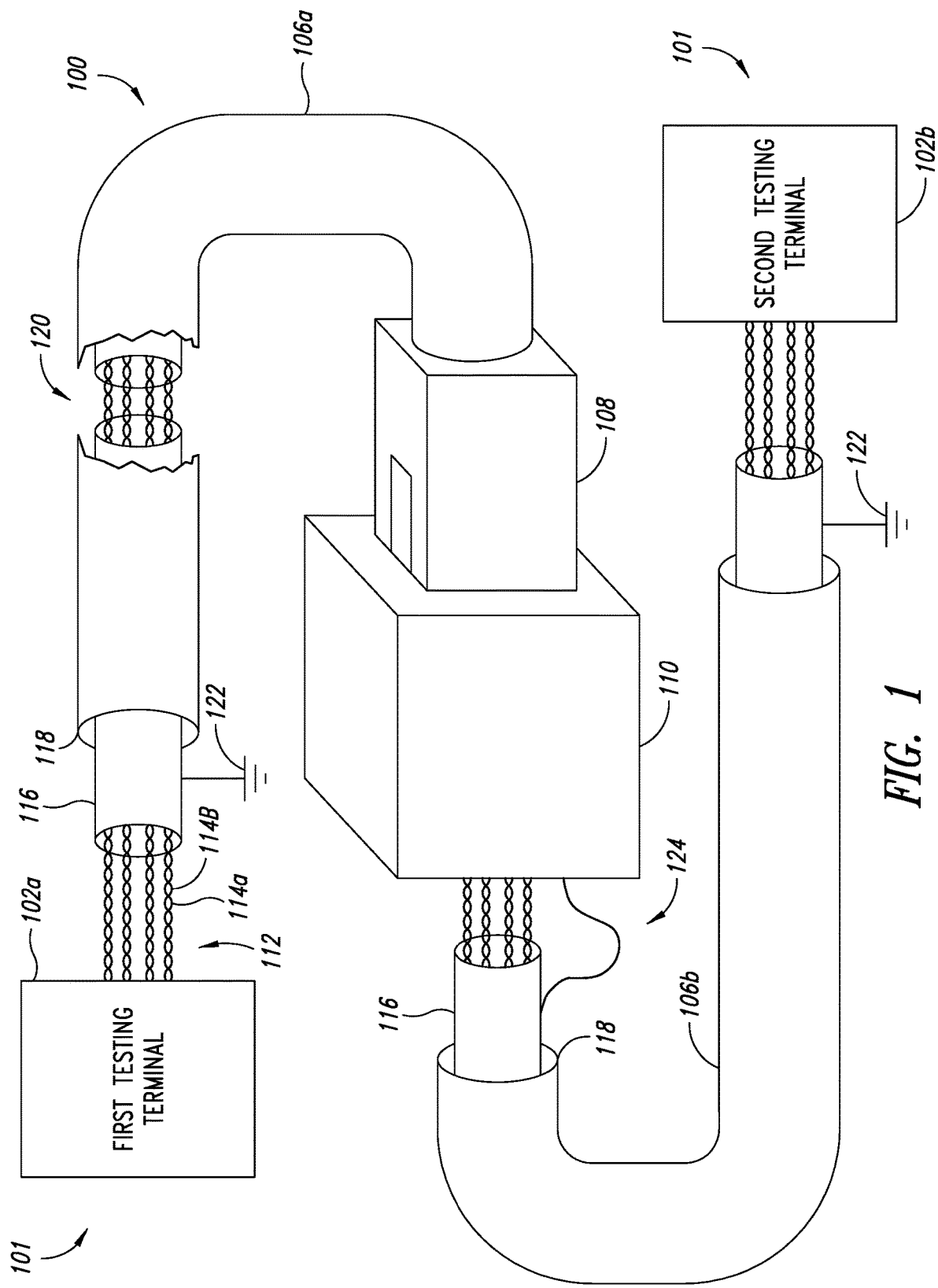
FIG. 1 shows a cabling installation under test coupled to a testing device.

FIG. 1 shows a cabling installation 100 under test coupled to a testing device 101. The testing device includes a first testing terminal 102a and a second testing terminal 102b. The cabling installation 100 includes a first cable 106a and a second cable 106b (collectively referred to herein by the numeral alone) connected together using a connector plug 108 and a connector jack 110. It is noted that although a cabling installation 100 including multiple cables 106 is described with reference to FIG. 1, the techniques described herein may be used for testing an installation with any number of cables or for testing one cable.

Each cable 106 includes a plurality of twisted pairs of conductors 112. Each pair 112 includes a first conductor 114a and a second conductor 114b twisted around each other to reduce electromagnetic radiation and crosstalk and improve external electromagnetic interference rejection. Although the plurality of twisted pairs are shown in FIG. 1 to include four pairs, it is noted that a cable 106 may have any number of conductors or pairs thereof. The conductor 114 may each be insulated with an insulator (not shown).

The plurality of twisted pairs 112 are shielded by a shield 116. The shield 116 surrounds the plurality of twisted pairs 112 over a length of the cable 106. The shield 116, which may be foil, provides an electrically conductive barrier to shield the conductors 114 from external electromagnetic waves. The cable 106 also has an insulator 118.

It is desirable for the shield 116 to be continuous without breakages or discontinuities. A discontinuity 120 in the shield 116 allows electromagnetic interference to reach the twisted pairs 112 and, consequently, degrades crosstalk (XT) performance of the cable 106, among other undesirable consequences.

In addition, the shield 116 of the cabling installation 100 may connected to a ground 122 at one or more points in the cabling installation 100. The ground connections may hinder direct current (DC) based shield verification techniques of shield 116 continuity by providing a parallel 'sneak' path for current applied to the shield. The parallel 'sneak' path bypasses the discontinuity 120, yielding a low resistance value and resulting in a false 'pass' in a DC-based verification technique.

The shield 116 may also have a drain wire 124 having a parasitic inductance. The second cable 106b of the cabling installation 100 is shown to be terminated at the connector jack 110 using the drain wire 124. Use of the drain wire 124 maintains continuity of the shield 116 through the cabling installation 100. However, unartful or unskillful termination of the second cable 106b (or any constituent cable 106) may result in the drain wire 124 having a parasitic inductance (for example, as a result of the drain wire 124 being several inches long or looping around itself). The drain wire 124 parasitic inductance may result in a false fail in common mode return loss shield verification techniques. Such techniques may declare the shield 116 to have a discontinuity when in fact the shield 116 is continuous, albeit having an unartfully- or unskillfully-terminated drain wire 124 that results in a relatively large parasitic inductance. U.S. Pat. No. 8,570,049, which is incorporated herein by reference in its entirety, describes common mode return loss-based testing of shield continuity.

As shown in FIG. 1, the first testing terminal 102a and the second testing terminal 102b of the testing device 101 are coupled to the cabling installation 100. The first testing terminal 102a may be a main instrument, and the second testing terminal 102b may be a remote instrument of the testing device 101. The second testing terminal 102b may be disposed in a location different than that of the first testing terminal 102a. In particular, the first testing terminal 102a is coupled to a first end of the conductors of the plurality of twisted pairs 112. The second testing terminal 102b is coupled to a second end of the conductors of the plurality of twisted pairs 112. The first testing terminal 102a performs a common mode sweep over a frequency range. At each frequency point over the plurality of frequency points in the sweep, the first testing terminal 102a transmits, at the first end of the conductors 114 of the plurality of twisted pairs 112, a first signal in common mode. In the common mode, the same first signal is transmitted over each conductor 114 of the cabling installation 100. The common mode signal traverses the conductors 114 of the installation 100.

The second testing terminal 102b receives a second signal at the second end of each conductor 114 of the plurality of twisted pairs 112. The second signal is representative of the first signal having undergone insertion loss as it traversed the conductor 114. The first or second testing terminal 102a, 102b determines a common mode insertion loss for the plurality of twisted pairs 112. Further, the first or second testing terminal 102a, 102b determines, based on the common mode insertion loss, whether there is a discontinuity in the shield 116. The first or second testing terminal 102a, 102b may also determine a location of the discontinuity.

Figure 2:
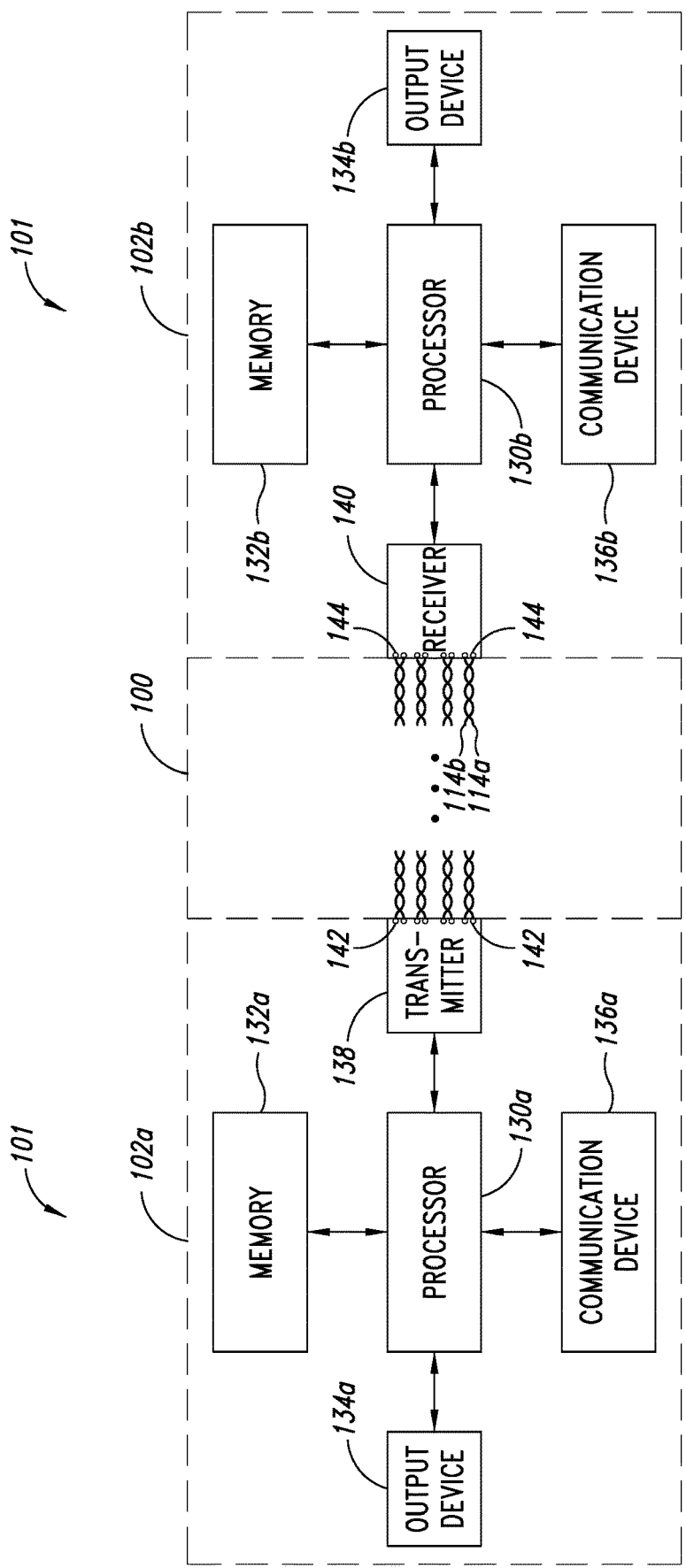
FIG. 2 shows block diagrams of first and second testing terminals of the testing device.

FIG. 2 shows block diagrams of the first and second testing terminals 102a, 102b of the testing device 101. The first and second testing terminals 102a, 102b are shown in FIG. 2 to be connected to the cabling installation 100. The first testing terminal 102a includes a processor 130a, memory 132a, an output device 134a, a communication device 136a and a transmitter 138 having a plurality of output terminals 142. The processor 130a is communicatively coupled to the memory 132a, output device 134a, communication device 136a and transmitter 138. The second testing terminal 102b includes a processor 130b, memory 132b, and output device 134b, a communication device 136b and a receiver 140. The processor 130b is communicatively coupled to the memory 132b, output device 134b, communication device 136b and receiver 140.

The transmitter 138 of the first testing terminal 102a has a plurality of output terminals 142. The plurality of output terminals 142 are connected to the plurality of conductors 114, respectively, of the cabling installation 100 at a first end. The receiver 140 has a plurality of input terminals 144. The plurality of input terminals 144 are connected to the plurality of conductors 114, respectively, at a second end of the cabling installation 100 different than the first end. Because the first and second ends may be in different locations (for example, when installed), two terminals 102a, 102b of the testing device 101 are illustrated for a local and remote end, respectively. However, it is recognized that one device/terminal may have both the transmitter 138 and the receiver 140 or a transceiver. The device/terminal may transmit the first signal as a test signal and receive the second signal that is representative of the first signal having traversed a conductor 114.

The processor 130a may be any type of device configured to execute executable instructions stored in the memory 132a. When the executable instructions are executed by the processor 130a, the executable instructions cause the processor 130a to perform the functions or techniques described herein. The processor 130a may be a controller, a microcontroller or a microprocessor, among others, and may include an arithmetic and logic unit (ALU), among other computational units. The processor 130a commands the transmitter 138 to transmit the first signal. The processor 130a also receives common mode insertion loss data detected by the second testing terminal 102b and determines based on the common mode insertion loss data whether the shield of the cabling installation 100 has a discontinuity as described herein. If so, the processor 130a determines a location of the discontinuity based on data obtained by the first or second terminal 102a, 102b.

The processor 130a outputs, to the output device 134a, data indicative of the results of the performed testing. For example, the processor 130a may output data representative of whether the shield 116 is determined to be continuous (e.g., 'pass') or discontinuous (e.g., 'fail'). The processor 102a may also determine a propagation delay for the cabling installation 100 based at least in part on a difference between a transmission time of the first signal and a reception time of the second signal.

The memory 132a may be any device that is configured to store executable instructions. The memory 132a may also store data pertaining to the performed continuity testing, such as a test result, discontinuity location, propagation delay or common mode insertion loss data. The memory 132a may include a random access memory (RAM) and/or a read-only memory (ROM). The output device 134a may be any type of device configured to output data to a user. For example, the output device 134a may be a display or a speaker, among others. The output device 134a may output, to a user, the results of shield continuity testing received from the processor 130a.

The communication device 136a may be any device that is configured to communicate with another device and transmit data to or receive data from the other device. The other device may be the communication device 136b of the second testing terminal 102b. The communication device 136a may communicate using a wireless or wired communications protocol. For example, the communication device 136a may be a modem or a transceiver. The communication device 136a receives data representative of the common mode insertion loss. The communication device 136a outputs the data to the processor 130a.

The transmitter 138 may be any device configured to transmit a signal, whereby the signal may be a common mode test signal transmitted over the conductors 114 described herein. The transmitter 138 has the plurality of output terminals 142 described herein. The plurality of output terminals 142 are used to connect the testing device 101 to a cable or cabling installation under test. The transmitter 138 outputs the common mode signal over the plurality of output terminals 142 for transmission over the plurality of conductors 114.

In the second testing terminal 102b, the processor 130b, memory 132b, output device 134b and communication device 136b are similar to the processor 130a, memory 132a, output device 134a and communication device 136a of the first testing terminal 102a described herein. The receiver 140 may be any device configured to receive the plurality of second signals. The receiver 140 has the plurality of input terminals 144 described herein. The receiver 140 receives, at the plurality of input terminals 144, the common mode signals transmitted over the plurality of conductors 114, respectively.

The receiver 140 outputs data representative of the received second signals to the processor 130b. The processor 130b may evaluate the data to determine the common mode insertion loss or the propagation delay for the cabling installation 100. Alternatively or in addition, the processor 130b may cause the data to be output to the communication device 136b for transmission to the communication device 136a of the first terminal 102a and for evaluation by the processor 130a.

Use of two testing terminals 102a, 102b is advantageous when the first and second ends of the conductors 114 are not in a proximity of each other. It is noted that although two testing terminals 102a, 102b are described herein as being respectively connected to two ends of the cabling installation 100, in various embodiments one testing terminal may be used. For example, the testing terminal may have both input and output terminals 142, 144. The input and output terminals 142, 144 may be respectively connected to both ends of the conductors 114, particularly when both ends are in a proximity of each other, such as when the cable is in a cable reel or spool.

Figure 3:
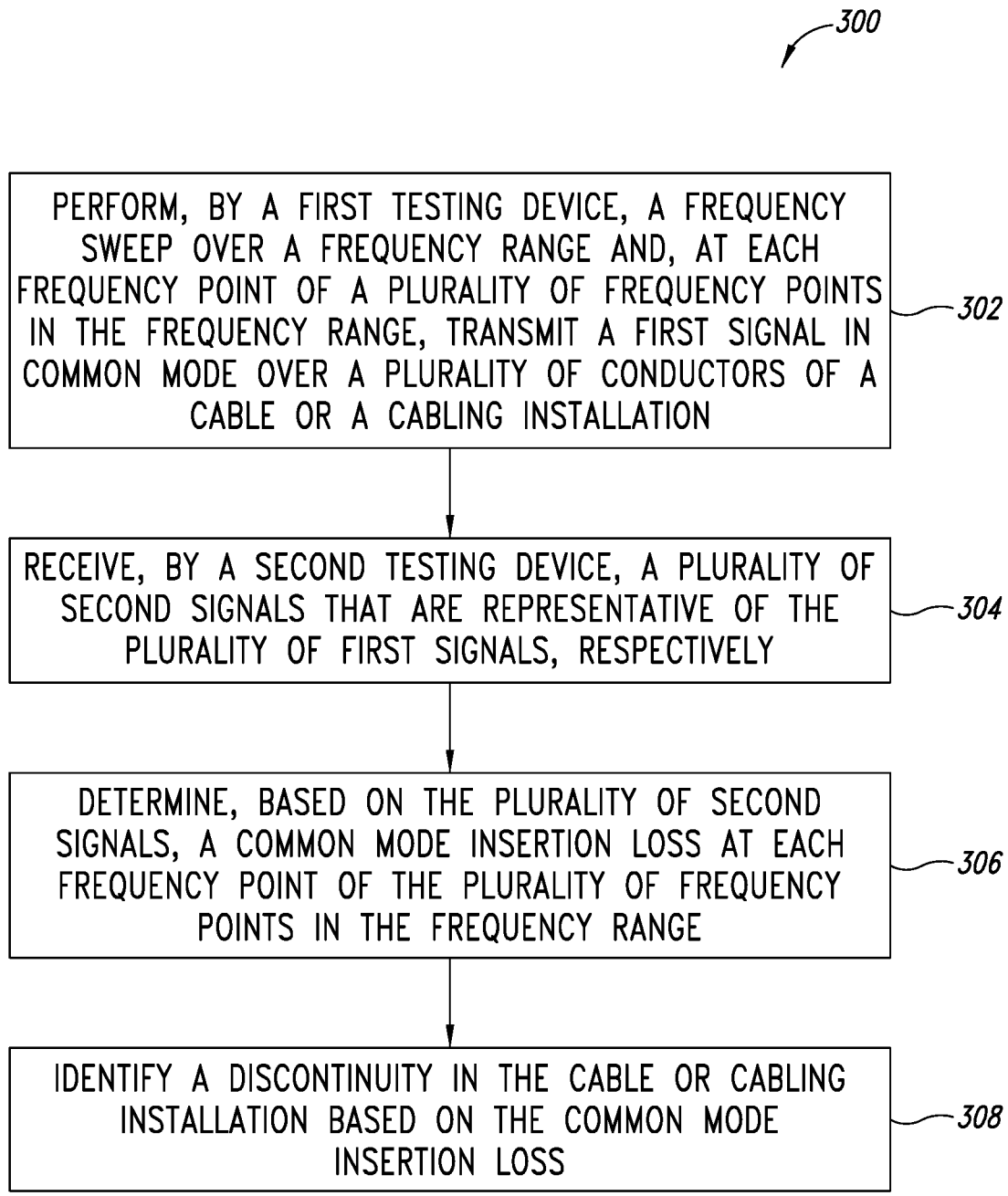
FIG. 3 shows a flow diagram of a method for testing shield continuity.

FIG. 3 shows a flow diagram of a method 300 for testing shield continuity. In the method 300, the testing device 101, at 302, performs a frequency sweep over a frequency range and, at each frequency point of a plurality of frequency points in the frequency range, transmits a first signal in common mode over a plurality of conductors 114 of a cable or a cabling installation, such as the cabling installation 100 described with reference to FIG. 1. The first signal is transmitted in common mode at the first end of the plurality of conductors 114, whereby the same first signal is transmitted over each conductor of the plurality of conductors 114. The plurality of conductors 114 are surrounded by the shield under test.

The cable 106 or the cables 106 of the cabling installation 100 may, for example, be Datacomm cables having four twisted pairs 112 (and eight total conductors 114) with each twisted pair 112 is an independent transmission line. As described herein, transmitting the first signal in common mode includes driving the plurality of conductors 114 simultaneously with the same first signal. For example, all the conductors 114 of the plurality of twisted pairs 112 of the cable 106 may be driven simultaneously relative to the shield 116 with the same first signal. In an embodiment, no one twisted pair 112 may remain not driven or neutral when the shield 116 is tested. For example, at the first end, the plurality of conductors 114 may be connected together and the first signal may be transmitted simultaneously over all of the plurality of conductors 114.

The frequency range may be in a low frequency, such as 1 to 20 megahertz (MHz). The plurality of frequency points may be separated by 1 MHz from each other, whereby the frequency points may be 1, 2, 3, . . . , 20 MHz. The first signal is transmitted simultaneously on the plurality of conductors 114.

Low-frequency signals, for example in the 1-20 MHz range, are advantageous in that when the shield surrounding the conductors 114 is discontinuous or broken, the first signal is impeded as it traverses the conductors 114. Conversely, if the shield is continuous, the first signal is relatively unimpeded. At relatively low frequencies, a signal having a larger magnitude is received at the second end of the conductors 114 when the shield is continuous than in the case when the shield is discontinuous. Particularly, an opening or breakage in the shield substantially blocks signal current from flowing in a loop formed by the shield and the conductors 114. The fact that a discontinuity impedes the first signal in the 1-20 MHz range is advantageously used to facilitate discontinuity detection.

At 304, the testing device 101, receives a plurality of second signals that are representative of the plurality of first signals, respectively, having traversed the respective plurality of conductors 114. The testing device 101 receives the plurality of second signals at the second ends of the plurality of conductors 114, respectively. At 306, the testing device 101 determines, based on the plurality of second signals, a common mode insertion loss at each frequency point of the plurality of frequency points in the frequency range. The testing device 101 also measures a propagation delay associated with the second signal of the plurality of second signals. The propagation delay may represent a duration of time between transmission of the first signal and reception of the second signal. The propagation delay is a function of a length of the cable or cabling installation 100 as longer cables or installations 100 are associated with longer traversal times.

The testing device 101 may determine a common mode insertion loss for each twisted pair 112 of the plurality of twisted pairs. The testing device 101 may average the common mode insertion loss of the plurality of twisted pairs to determine the common mode insertion loss at 306 for the cabling installation 100. The determined common mode insertion loss may also be any function of a plurality of common mode insertion losses of the plurality of twisted pairs, respectively. The common mode signal levels for all twisted pairs 112 of the cable 116 are measured and averaged at the second end. In the event that the cable 106 is a Datacomm cable, four common mode signal levels are measured (one for each twisted pair 112) and averaged for determining the common mode insertion loss.

The testing device 101 identifies a discontinuity in the cable or cabling installation based on the common mode insertion loss at 308. It is noted that in various embodiments, the second testing terminal 102b may send data representative of the common mode insertion loss to the first testing terminal 102a, by wired or wireless communication. The first testing terminal 102a may then determine whether there is a discontinuity in the cable or the cabling installation based on the data received from the second testing terminal 102b. Furthermore, in an embodiment the second testing terminal 102b sends data representative of the received plurality of second signals to the first testing terminal 102a, and the first testing terminal 102a determines the common mode insertion loss and identifies the discontinuity based on the plurality of second signals.

It is noted that when a low resistance DC sneak path is present due to grounding the shield as described with reference to FIG. 1, the DC sneak path has a relatively high associated alternating current (AC) impedance. The testing device 101 transmits the first signals for testing the shield 116 over the conductors of the cabling installation. If the shield is open (or discontinuous) and the DC sneak path is present, the insertion loss is markedly different than had the shield been continuous. The techniques described herein detect shield discontinuity even when the DC sneak path is present and are not susceptible to (or present a false negative when) a DC sneak path is present.

Figure 4:
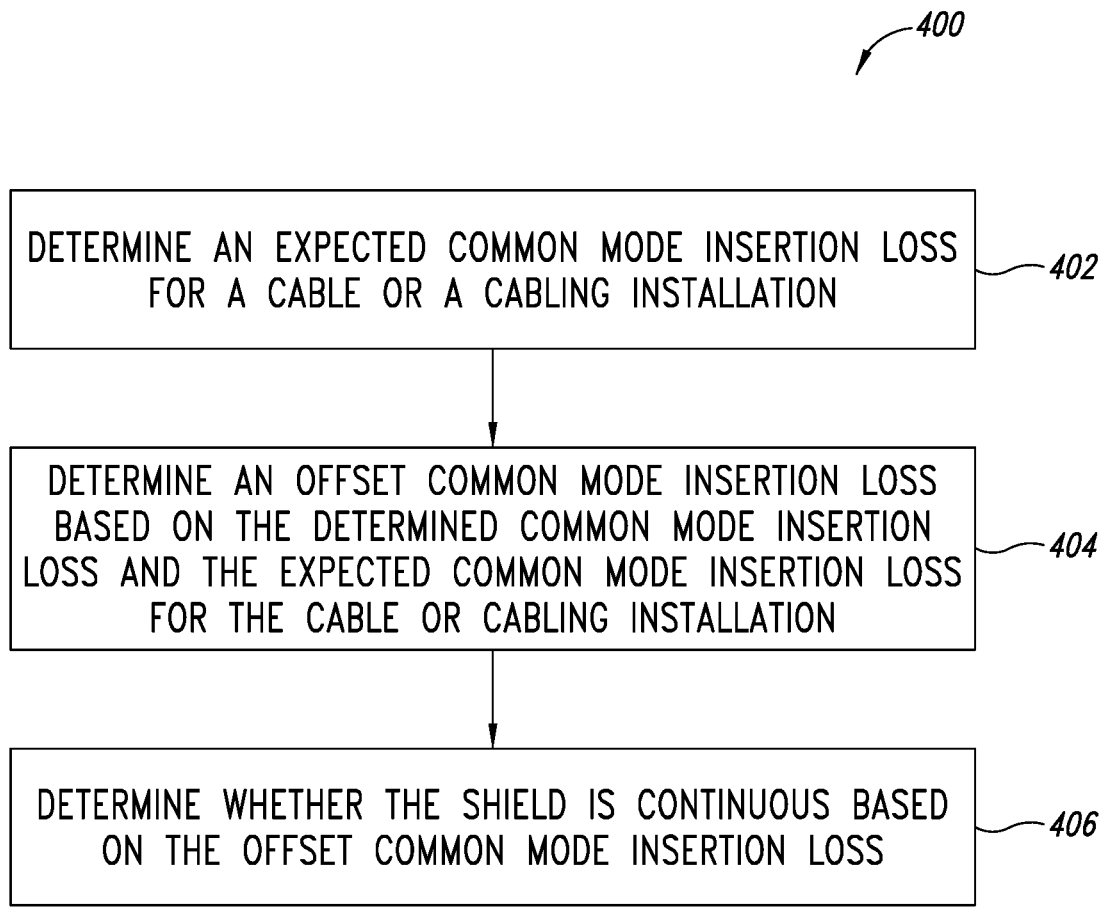
FIG. 4 shows a flow diagram of a method for testing shield continuity.
Figure 5:
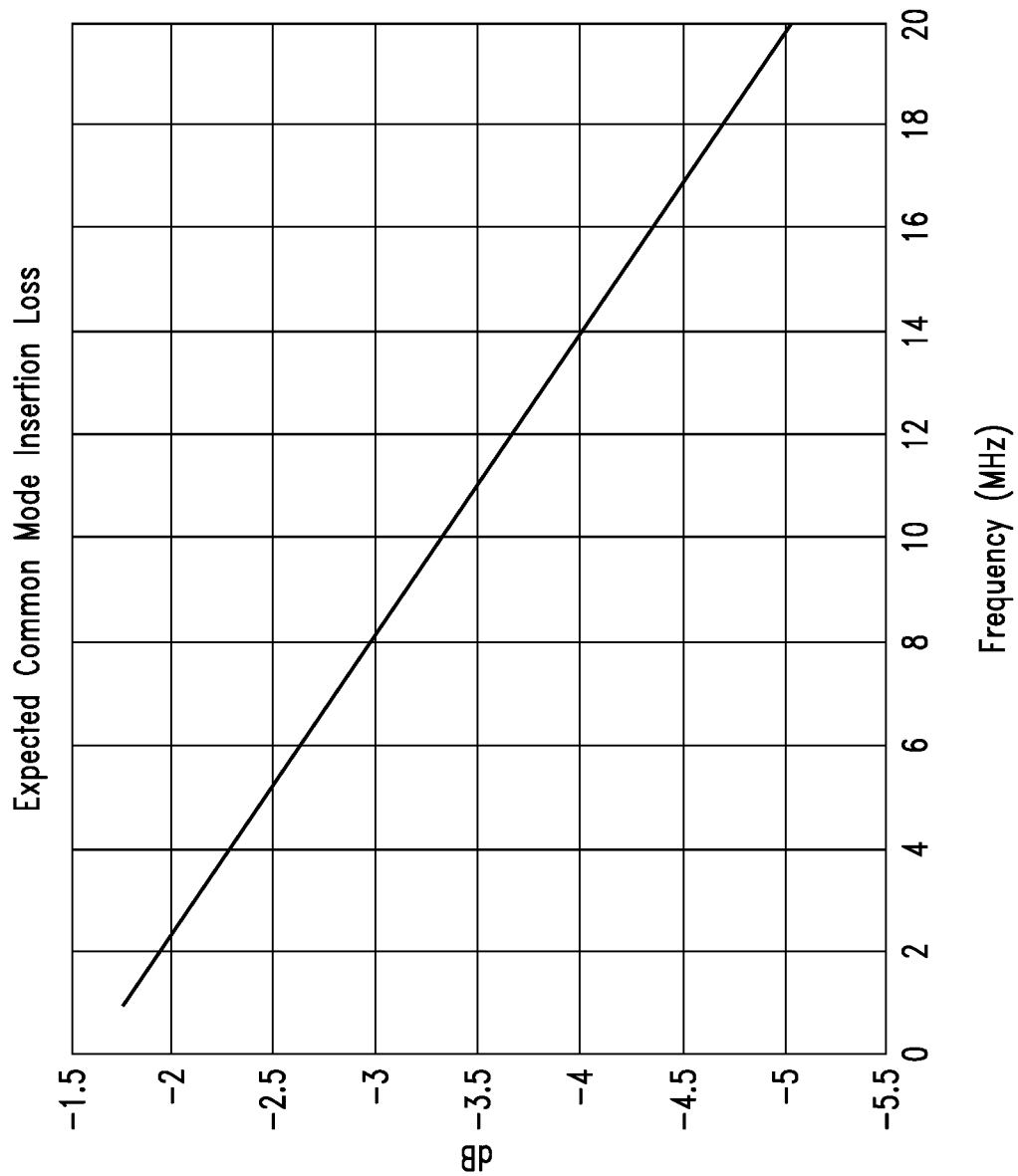
FIG. 5 shows an example of an expected common mode insertion loss for a cable or a cabling installation.

FIG. 4 shows a flow diagram of a method 400 for testing shield continuity. In the method 400, at 402, the testing device 101 determines an expected common mode insertion loss for a cable or a cabling installation. The expected common mode insertion loss may be determined based on (or as a function of) the propagation delay and/or the second signals received at the frequency points of the frequency sweep. The expected common mode insertion loss (in decibels (dB)) may be a linear function of the frequency and/or inversely correlated with the frequency. Because the propagation delay is a function of cable or cabling installation length, cables or cabling installations of different lengths have different expected common mode insertion loss profiles. FIG. 5 shows an example of the expected common mode insertion loss for a cable or a cabling installation. Higher frequencies in the frequency range are associated with a lower expected common mode insertion loss. The example expected common mode insertion loss of FIG. 5 is for a 50 meter (m) cable or cabling installation.

At 404, the testing device 101 determines an offset common mode insertion loss based on the determined common mode insertion loss and the expected common mode insertion loss for the cable or cabling installation. The offset common mode insertion loss may be determined for each frequency point in the frequency range. The offset common mode insertion loss may be determined as a difference between the determined common mode insertion loss (at step 306) and the expected common mode insertion loss for the cable or cabling installation for each frequency point in the frequency range. If the determined common mode insertion loss and expected common mode insertion loss correspond to each other (for example, have close to a zero dB difference), the shield may be determined to be continuous. Alternatively, if the determined common mode insertion loss and expected common mode insertion loss do not correspond to each other, the shield may be determined to be discontinuous. At 406, the testing device 101 determines whether the shield is continuous based on the offset common mode insertion loss.

Figure 6:
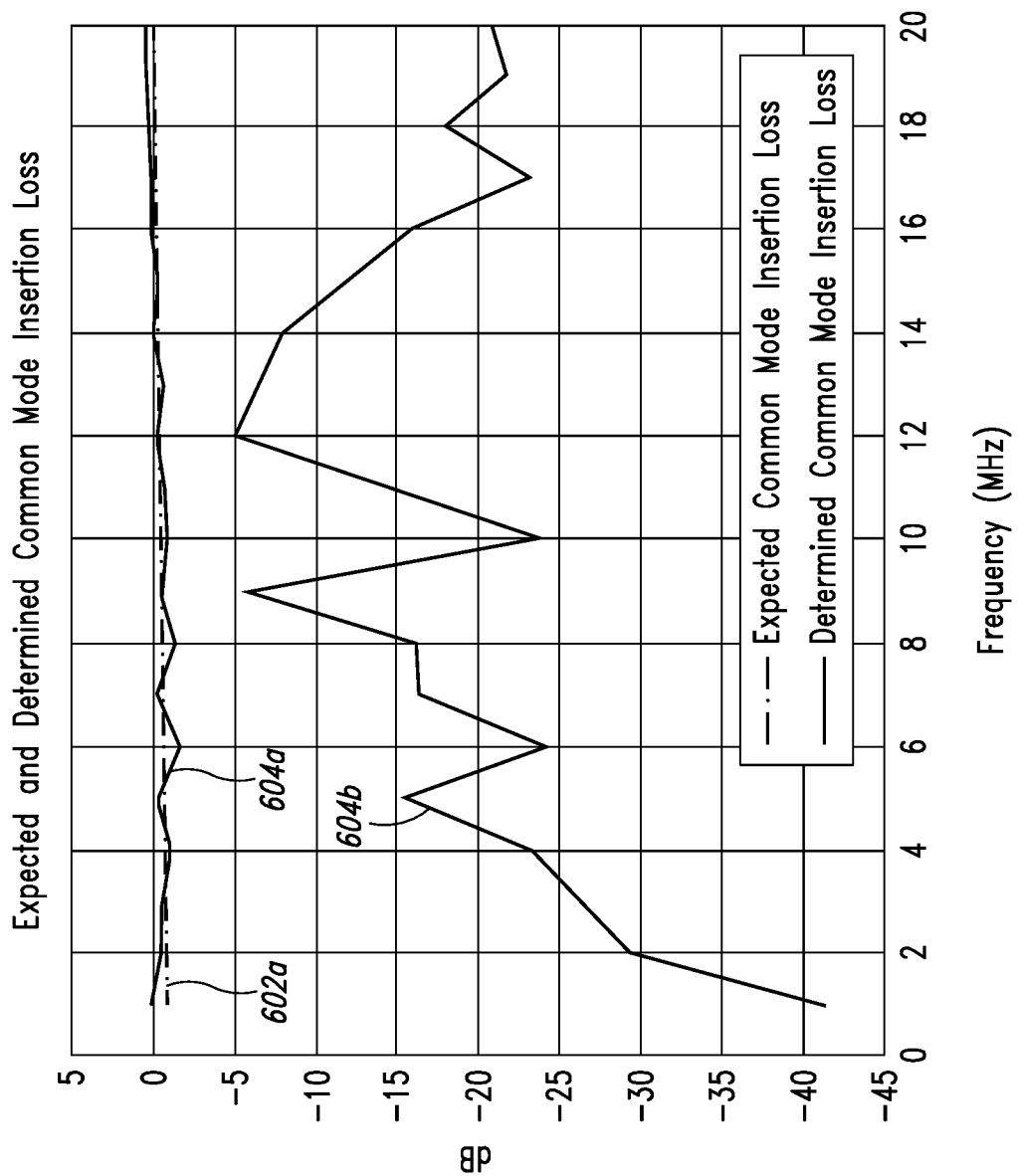
FIG. 6 shows examples of the expected and determined common mode insertion loss for two cables over a frequency range.

FIG. 6 shows examples of the expected and determined common mode insertion loss for two cables over a frequency range. For a first cable, the determined common mode insertion loss 604a largely corresponds with and tracks the expected common mode insertion loss 602a over the frequency range. The difference between the determined and expected common mode insertion losses 604a, 602a for the first cable is not larger than 2 dB at any frequency point in the frequency range. The first cable may, thus, be determined to have a continuous shield. Conversely, a determined common mode insertion loss 604b and the expected common mode insertion loss 602a a second cable diverge from each other over the frequency range. The difference between the determined and expected common mode insertion losses 604b, 602a for the second cable can be as much as 40 dB. Accordingly, the second cable may, thus, be determined to have a discontinuous shield.

The determined and expected common mode insertion losses may be compared over a segment (or a subrange) of the frequency range rather than the entirety of the frequency range. Further, a figure of merit may be used to quantify the difference between the determined and expected common mode insertion losses (i.e., the offset common mode insertion loss). The figure of merit may be compared to threshold to determine whether the shield is continuous with discontinuous.

Figure 7:
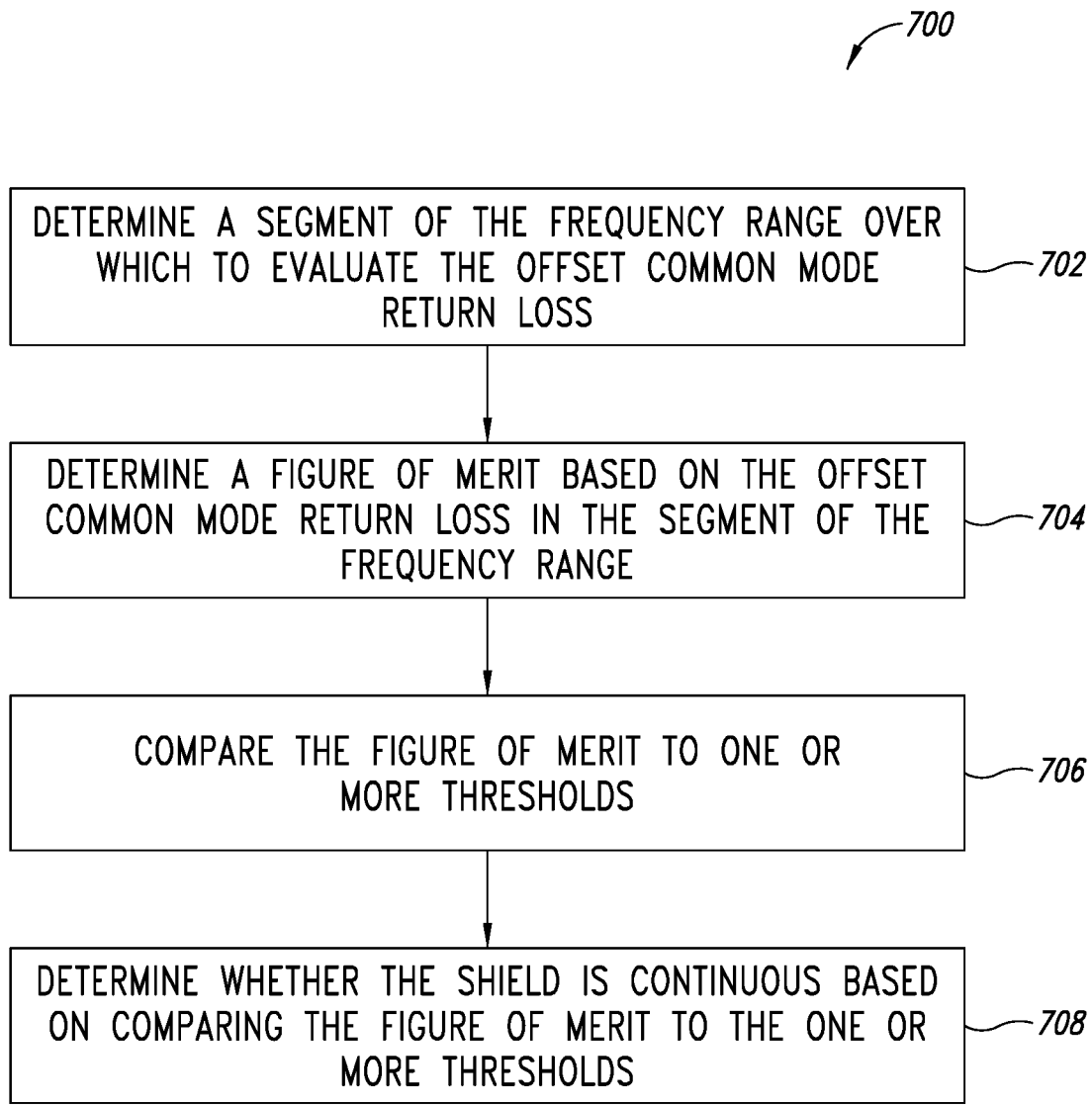
FIG. 7 shows a flow diagram of a method for testing shield continuity.

FIG. 7 shows a flow diagram of a method 700 for testing shield continuity. In the method 700, the testing device 101 at 702 determines a segment of the frequency range over which to evaluate the offset common mode insertion loss. The segment of the frequency range may any portion of (for example, half of) the entire frequency range. For example, if the frequency range has twenty frequency points between 1 and 20 MHz, the segment may be any ten consecutive frequency points between 1 and 20 MHz.

The segment may be determined based on the length of the cable or cabling installation under test (or the propagation delay associated with the cable or cabling installation). For example, a cable or cabling installation having a relatively short length, which is associated with a relatively short propagation delay, may have an associated segment that is closer to the end of the frequency range. Alternatively, a cable or cabling installation having a relatively long length (for example, having a propagation delay of at least 42 nanoseconds (ns)) may have an associated segment that is closer to the beginning of the frequency range.

Figure 8:
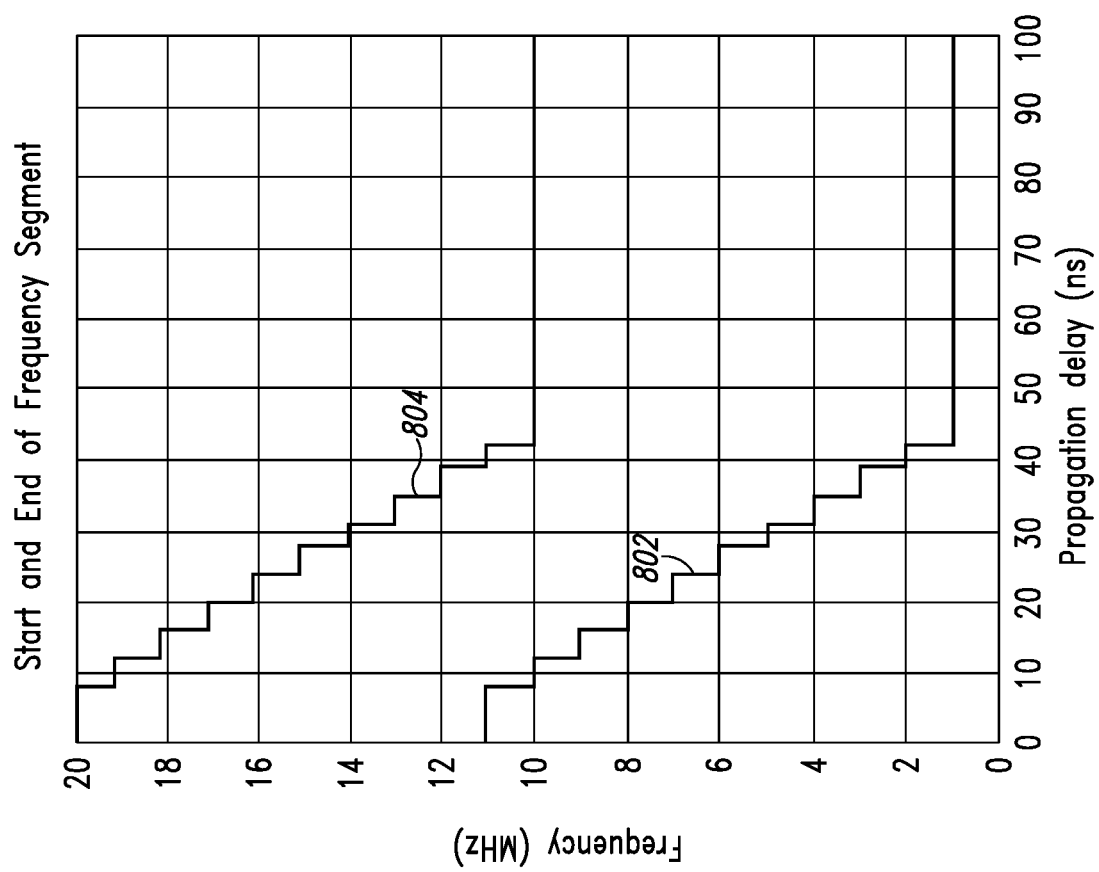
FIG. 8 shows an example of frequency range segments in relation to propagation delays.

FIG. 8 shows an example of frequency range segments in relation to propagation delays. The size of each frequency range segment is ten frequency points, which is half of the entire frequency range between 1 and 20 MHz. Each frequency range segment ranges between a starting frequency point 802 and an end frequency point 804. Cables or cabling installations that are longer than 50 m (or have an associated propagation delay of 42 ns or higher) are tested based on a frequency range segment that is at the lower end of the frequency range (or between 1 and 10 MHz). Frequency points outside the frequency segment (for example, between 11 and 20 MHz) are not used for testing the shields of the cables or cabling installations.

Referring back to FIG. 7, at 704, the testing device 101 determines a figure of merit based on the offset common mode insertion loss in the segment of the frequency range. The figure of merit may be representative of deviation of the offset common mode insertion loss from a zero value. The figure of merit may be based on a standard deviation or a variance of the offset common mode insertion loss for a cable or cabling installation. A higher variance represents larger deviations from the expected common mode insertion loss and is consequently indicative of a discontinuity in the shield.

In an embodiment, the figure of merit may be represented as:

$$\text{Figure of merit} = \mu_{OCMIL} - \sigma_{OCMIL} \quad \text{Equation (1)},$$

where $\mu_{OCMIL}$ is the mean of the offset common mode insertion loss over the segment of the frequency range. The mean of the offset common mode insertion loss over the segment of the frequency range may be determined as:

$$\mu_{OCMRL} = \frac{\sum_{f=f_1}^{f_N} OCMIL(f)}{N}, \quad \text{Equation (2)}$$

where $f_1$ is the starting frequency point in the segment, $f_N$ is the end frequency point in the segment, N is the number of frequency points in the segment (for example, ten as shown in FIG. 8) and OCMIL(f) is the offset common mode insertion loss over the segment of the frequency range. $\sigma_{OCMIL}$ in Equation (1) may represent a standard deviation of the difference between the offset common mode insertion loss over the segment of the frequency range (OCMIL(f)) and a least mean squares (LMS) fit for the offset common mode insertion loss over the segment (LMSOCMIL(f)). The standard deviation may be determined as:

$$\sigma_{OFCMRL} = \sqrt{\sum_{f=f_1}^{f_N} (OCMIL(f) - LMSOCMIL(f))^2}. \quad \text{Equation (3)}$$

The variation in the offset common mode insertion loss over the segment is negatively correlated with the figure of merit. A relatively large figure of merit is indicative of shield continuity, whereas a relatively small figure of merit indicates that the shield has a discontinuity.

The testing device 101 compares the figure of merit to one or more thresholds at 706 and determines, at 708, whether the shield is continuous based on comparing the figure of merit to the one or more thresholds. For example, if the figure of merit is greater than a threshold, the testing device 101 may deem the shield of the cable or cabling installation to be continuous. Conversely, if the figure of merit is less than the threshold, the testing device 101 may deem the shield of the cable or cabling installation to be discontinuous.

If the shield is determined to be discontinuous, the testing device 101 may identify a location of the discontinuity based on common mode return loss data for the cable or cabling installation.

Figure 9:
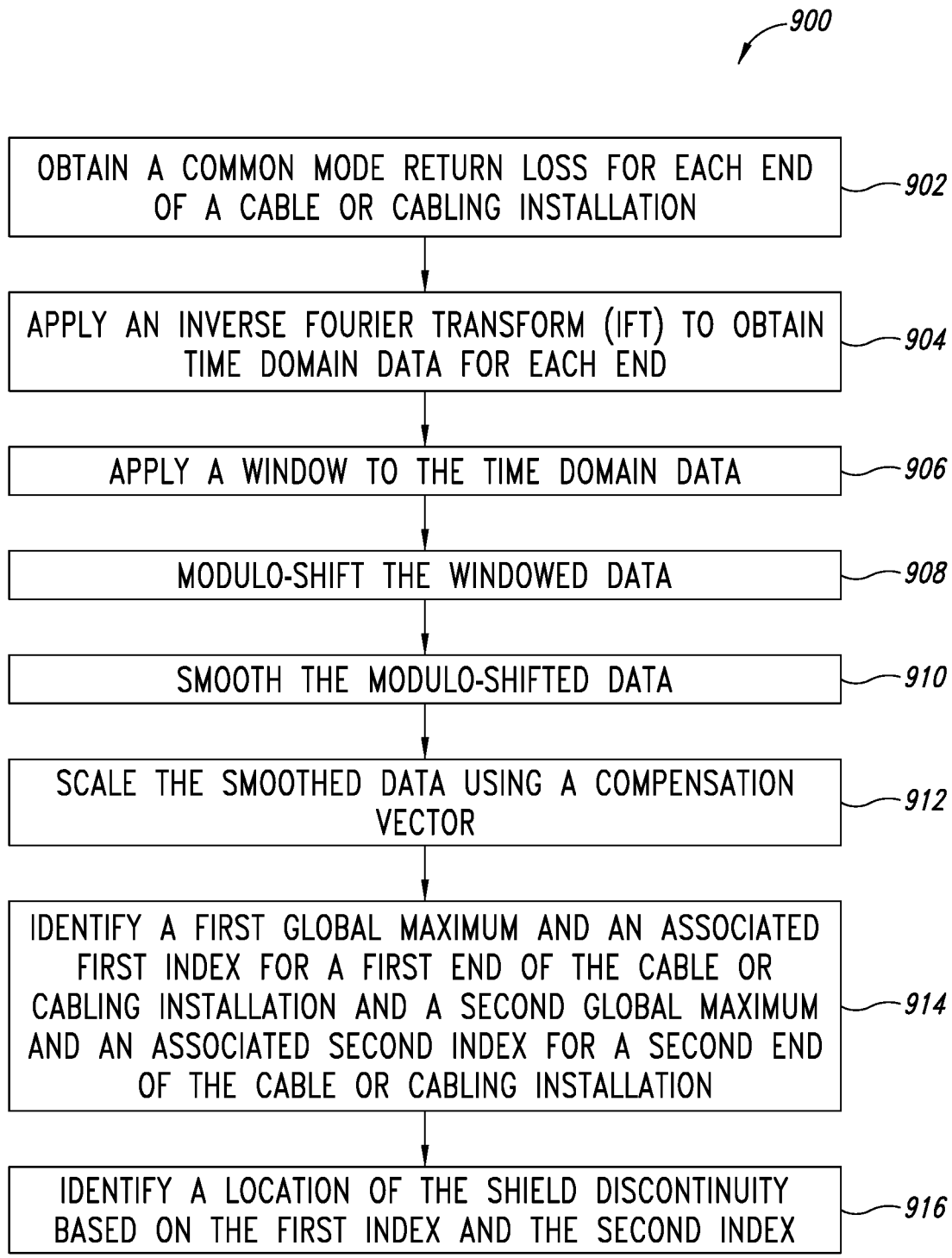
FIG. 9 shows a method for determining a location of a discontinuity in a cable or cabling installation.

FIG. 9 shows a method 900 for determining a location of a discontinuity in a cable or cabling installation. In the method 900, the testing device 101 obtains, at 902, a common mode return loss for each end of a cable or cabling installation. At 904, the testing device 101 applies an inverse Fourier Transform (IFT) to the common mode return loss to obtain time domain data for each end. The IFT may be an inverse Fast Fourier Transform (IFFT) having any size. For example, the IFFT may be a 301-point IFFT in steps of 1 MHz. At 906, the testing device 101 applies a window to the time domain data. The window may, for example, be a Blackman window.

The testing device 101 modulo-shifts the windowed data at 908. The testing device 101 may modulo-shift the windowed data using any number of points, such as ten points. The testing device 101 then smooths the modulo-shifted data at 910. For example, a bi-directional moving-average filter having a boxcar width of four may be used to smooth the modulo-shifted data.

The testing device 101 scales the smoothed data using a compensation vector at 912. Scaling the smoothed data may include multiplying the data with a predetermined attenuation compensation vector to compensate for a reflected pulse's level variation with distance. At 914, the testing device 101 identifies a first global maximum and an associated first index for a first end of the cable or cabling installation and a second global maximum and an associated second index for a second end of the cable or cabling installation. The testing device 101 identifies a location of the shield discontinuity based on the first index and the second index at 916. For example, a spike in the scaled data may indicate a shield discontinuity. The location of the discontinuity corresponds to the index of the spike in the scaled time-domain data. For example, a location of the index in the compensated data, which is time domain data, corresponds to a location of the discontinuity in the cable. For example, if the index is at the center of the compensated data, the discontinuity is determined to be at the center of the cable.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A shield continuity testing device, comprising:
 a transmitter configured to transmit a first signal in common mode over a plurality of conductors of a cable or cabling installation having a shield, the transmitter being configured to transmit the first signal in the common mode at a first end of the plurality of conductors;
 a receiver configured to receive a plurality of second signals representative of the first signal at a second end of the plurality of conductors, respectively, and output data representative of the plurality of second signals; and
 a processor configured to:
  receive the data representative of the plurality of second signals;
  determine a common mode insertion loss for the cable or cabling installation based on the plurality of second signals;
  determine, based on the common mode insertion loss, whether the shield is continuous or discontinuous by at least:
   determining an expected common mode insertion loss for the cable or cabling installation;
   determining an offset common mode insertion loss as a difference between the expected common mode insertion loss and the common mode insertion loss; and
   determining whether the shield is continuous or discontinuous based on the offset common mode insertion loss; and
  output data representative of whether the shield is continuous or discontinuous.

2. The shield continuity testing device of claim 1, wherein the first signal spans a frequency range, and the transmitter is configured to transmit the first signal at a plurality of frequency points in the frequency range.

3. The shield continuity testing device of claim 2, wherein the processor is configured to determine the common mode insertion loss by at least:
 determining, based on the plurality of second signals, the common mode insertion loss at each frequency point of the plurality of frequency points in the frequency range.

4. The shield continuity testing device of claim 2, wherein the frequency range is between 1 and 20 megahertz (MHz).

5. The shield continuity testing device of claim 1, wherein the processor is configured to determine whether the shield is continuous or discontinuous by at least:
 determining a figure of merit for the offset common mode insertion loss; and
 comparing the figure of merit to a threshold.

6. The shield continuity testing device of claim 5, wherein the processor is configured to determine the figure of merit by at least:
 determining a mean of the offset common mode insertion loss over a plurality of frequency points in a frequency range over which the first signal is transmitted;
 determining a standard deviation of a difference between the offset common mode insertion loss over the plurality of frequency points and a least mean square fit of the offset common mode insertion loss over the plurality of frequency points; and
 determining the figure of merit as a difference between the mean and the standard deviation.

7. The shield continuity testing device of claim 5, wherein the processor is configured to determine that the shield is continuous if the figure of merit is greater than or equal to the threshold and determine that the shield is discontinuous if the figure of merit is less than the threshold.

8. The shield continuity testing device of claim 1, wherein the processor is configured to determine whether the shield is continuous or discontinuous based on the common mode insertion loss in a subrange of a frequency range over which the first signal is transmitted, and wherein the processor is configured to:
    identify the subrange based on a signal propagation delay of the cable or cabling installation.

9. The shield continuity testing device of claim 8, wherein a location of the subrange in the frequency range is inversely correlated to the signal propagation delay such that an increase in the signal propagation delay results in shifting the subrange towards a beginning of the frequency range and a decrease in the signal propagation delay results in shifting the subrange towards an end of the frequency range.

10. The shield continuity testing device of claim 1, wherein the plurality of conductors of the cable or cabling installation have a twisted pair arrangement in which a pair of conductors of the plurality of conductors are pair-wise twisted around each other.

11. The shield continuity testing device of claim 1, comprising:
    an output device, communicatively coupled to the processor, configured to receive the data representative of whether the shield is continuous or discontinuous, and output an indication of whether the shield is continuous or discontinuous.

12. The shield continuity testing device of claim 1, wherein the processor is configured to determine a location of a discontinuity of the shield by at least:
    determining a common mode return loss for the cable or cabling installation;
    applying a Fourier transform to the common mode return loss to obtain time domain data;
    scaling the time domain data using a compensation vector;
    determining an index associated with a maximum of the scaled time domain data; and
    determining the location of the discontinuity along the cable or cabling installation based on the index associated with the maximum of the scaled time domain data.

13. The shield continuity testing device of claim 12, wherein a relative location of the index in the scaled time domain data corresponds to the relative location of the discontinuity in the shield.

14. A method for testing shield continuity, comprising:
    transmitting a first signal in common mode over a plurality of conductors of a cable or cabling installation having a shield, the first signal in the common mode at a first end of the plurality of conductors;
    receiving a plurality of second signals representative of the first signal at a second end of the plurality of conductors, respectively;
    determining a common mode insertion loss for the cable or cabling installation based on the plurality of second signals;
    determining, based on the common mode insertion loss, whether the shield is continuous or discontinuous by at least:
        determining an expected common mode insertion loss for the cable or cabling installation;
        determining an offset common mode insertion loss as a difference between the expected common mode insertion loss and the common mode insertion loss; and
        determining whether the shield is continuous or discontinuous based on the offset common mode insertion loss; and
    outputting data representative of whether the shield is continuous or discontinuous.

15. The method of claim 14, comprising:
    transmitting the first signal over a plurality of frequency points in a frequency range.

16. The method of claim 15, comprising:
    determining, based on the plurality of second signals, the common mode insertion loss at each frequency point of the plurality of frequency points in the frequency range, wherein the frequency range is between 1 and 20 megahertz (MHz).

17. The method of claim 14, comprising:
    determining a mean of the offset common mode insertion loss over a plurality of frequency points in a frequency range over which the first signal is transmitted;
    determining a standard deviation of a difference between the offset common mode insertion loss over the plurality of frequency points and a least mean square fit of the offset common mode insertion loss over the plurality of frequency points;
    determining a figure of merit as a difference between the mean and the standard deviation; and
    determining that the shield is continuous if the figure of merit is greater than or equal to a threshold and determine that the shield is discontinuous if the figure of merit is less than the threshold.

18. The method of claim 14, comprising:
    determining a common mode return loss for the cable or cabling installation;
    applying a Fourier transform to the common mode return loss to obtain time domain data;
    scaling the time domain data using a compensation vector;
    determining an index associated with a maximum of the scaled time domain data; and
    determining a location of a discontinuity along the cable or cabling installation based on the index associated with the maximum of the scaled time domain data.

19. A shield continuity testing device, comprising:
    a transmitter configured to transmit a first signal in common mode over a plurality of conductors of a cable or cabling installation having a shield, the transmitter being configured to transmit the first signal in the common mode at a first end of the plurality of conductors;
    a receiver configured to receive a plurality of second signals representative of the first signal at a second end of the plurality of conductors, respectively, and output data representative of the plurality of second signals; and
    a processor configured to:
        receive the data representative of the plurality of second signals;
        determine a common mode insertion loss for the cable or cabling installation based on the plurality of second signals;
        determine, based on the common mode insertion loss, whether the shield is continuous or discontinuous, wherein the processor is configured to determine whether the shield is continuous or discontinuous based on the common mode insertion loss in a subrange of a frequency range over which the first signal is transmitted, and identify the subrange based on a signal propagation delay of the cable or cabling installation; and
        output data representative of whether the shield is continuous or discontinuous.

20. The shield continuity testing device of claim 19, wherein the transmitter is configured to transmit the first signal at a plurality of frequency points in the frequency range.

* * * * *